(12) United States Patent
Gebeshuber et al.

(10) Patent No.: US 9,530,624 B2
(45) Date of Patent: Dec. 27, 2016

(54) METHOD FOR THE PLASMA COATING OF A SUBSTRATE, IN PARTICULAR A PRESS PLATEN

(71) Applicant: Berndorf Hueck Band- und Pressblechtechnik GmbH, Berndorf (AT)

(72) Inventors: Andreas Gebeshuber, Neuzeug (AT); Daniel Heim, Wels (AT); Johann Laimer, Baden (AT); Thomas Mueller, Gunskirchen (AT); Michael Proschek, Schoenau (AT); Otto Stadler, Hernstein (AT); Herbert Stoeri, Wiener Neustadt (AT)

(73) Assignee: Berndorf Hueck Band- und Pressblechtechnik GmbH, Berndorf (AT)

( * ) Notice: Subject to any disclaimer, the term of this patent is extended or adjusted under 35 U.S.C. 154(b) by 0 days.

(21) Appl. No.: 14/420,194

(22) PCT Filed: Aug. 6, 2013

(86) PCT No.: PCT/AT2013/050152
§ 371 (c)(1),
(2) Date: Feb. 6, 2015

(87) PCT Pub. No.: WO2014/022872
PCT Pub. Date: Feb. 13, 2014

(65) Prior Publication Data
US 2015/0255254 A1 Sep. 10, 2015

(30) Foreign Application Priority Data

Aug. 8, 2012 (AT) .................. A 877/2012

(51) Int. Cl.
*C23C 16/50* (2006.01)
*H05H 1/24* (2006.01)
*H01J 37/32* (2006.01)
*C23C 16/52* (2006.01)

(52) U.S. Cl.
CPC ......... *H01J 37/32532* (2013.01); *C23C 16/50* (2013.01); *C23C 16/52* (2013.01); *H01J 37/32577* (2013.01)

(58) Field of Classification Search
CPC ...... C23C 16/50; C23C 16/505; C23C 16/509; H05H 1/24
See application file for complete search history.

(56) References Cited

U.S. PATENT DOCUMENTS

| 3,984,043 A * | 10/1976 | Kreider .............. B23K 20/2333 228/190 |
| 4,885,074 A | 12/1989 | Susko et al. |
| 5,156,820 A | 10/1992 | Wong et al. |
| 5,244,375 A | 9/1993 | Laurence et al. |
| 5,273,588 A | 12/1993 | Foster et al. |
| 5,286,360 A | 2/1994 | Szczyrbowski et al. |
| 6,190,514 B1 | 2/2001 | Ma et al. |
| 7,311,869 B2 | 12/2007 | Espe et al. |
| 2002/0155957 A1* | 10/2002 | Danly, Sr. ............... F16C 33/12 508/103 |
| 2002/0159216 A1 | 10/2002 | Ennis |
| 2003/0052085 A1* | 3/2003 | Parsons ............ H01J 37/32082 216/60 |
| 2003/0089314 A1 | 5/2003 | Matsuki et al. |
| 2003/0215690 A1* | 11/2003 | Wald ................... H01M 8/0273 429/483 |
| 2004/0239003 A1 | 12/2004 | Espe et al. |
| 2005/0082709 A1* | 4/2005 | von Haas ............... B27N 3/086 264/109 |
| 2005/0236513 A1* | 10/2005 | Piguet ................... B65H 23/32 242/615 |
| 2006/0221540 A1 | 10/2006 | Himori et al. |
| 2007/0042131 A1 | 2/2007 | Soo et al. |
| 2008/0202240 A1* | 8/2008 | De Boer ................ G01P 15/18 73/514.16 |
| 2008/0254281 A1* | 10/2008 | Chen .................... B29C 51/004 428/335 |
| 2010/0015343 A1* | 1/2010 | Setiabudi ................ C08L 61/34 427/389.9 |
| 2010/0252744 A1* | 10/2010 | Herrmann ............... G01T 1/241 250/370.14 |

(Continued)

FOREIGN PATENT DOCUMENTS

| CN | 1842244 A | 10/2006 |
| CN | 101267708 A | 9/2008 |

(Continued)

OTHER PUBLICATIONS

Curran, J.A., et al., "Mullite-rich plasma electrolytic oxide coatings for thermal barrier applications". Surface & Coatings Technology 201 (2007) 8683-8687.*

(Continued)

*Primary Examiner* — Bret Chen
(74) *Attorney, Agent, or Firm* — Collard & Roe, P.C.

(57) ABSTRACT

An apparatus for the plasma coating of a substrate, in particular a press platen, is provided and is used to perform a method to plasma coat the press platen. The apparatus includes a vacuum chamber and, arranged therein, an electrode, which is segmented. Each of the electrode segments has a dedicated connection for an electrical source. Also provided is the method for operating the apparatus. According to the method, a substrate to be coated is positioned opposite the electrode and at least one energy source that is assigned to an electrode segment is activated. Moreover, a gas is introduced, with the effect of bringing about plasma-enhanced chemical vapor deposition on the substrate.

11 Claims, 6 Drawing Sheets

(56) References Cited

U.S. PATENT DOCUMENTS

| | | | | |
|---|---|---|---|---|
| 2011/0009805 | A1* | 1/2011 | Imran | A61N 1/0428 604/20 |
| 2011/0036707 | A1 | 2/2011 | Horishita et al. | |
| 2012/0180810 | A1 | 7/2012 | Beckmann et al. | |
| 2012/0247543 | A1* | 10/2012 | Zehavi | H01L 31/0747 136/255 |

FOREIGN PATENT DOCUMENTS

| | | |
|---|---|---|
| CN | 102597306 A | 7/2012 |
| DE | 44 43 608 C1 | 3/1996 |
| DE | 197 57 141 A1 | 6/1999 |
| EP | 1 417 090 B1 | 5/2004 |
| GB | 2 181 460 A | 4/1987 |
| JP | 04-063267 A | 2/1992 |
| JP | H11-246691 A | 9/1999 |
| JP | 2008-274366 A | 11/2008 |
| JP | 2009-280890 A | 12/2009 |
| JP | 2012-134320 A | 7/2012 |
| NZ | 245181 A | 12/1995 |

OTHER PUBLICATIONS

Tsao, C.W., et al., "Low temperature bonding of PMMA and COC microfluidic substrates using UV/ozone surface treatment". Lab Chip, 2007, 7, 499-505.*

Lenling, W.J., et al., "Thermal Coating Development for Impulse Drying". Journal of Thermal Spray Technology, vol. 2(2) Jun. 1993, pp. 173-178.*

International Search Report of PCT/AT2013/050152, mailed Mar. 26, 2014.

* cited by examiner

METHOD FOR THE PLASMA COATING OF A SUBSTRATE, IN PARTICULAR A PRESS PLATEN

CROSS REFERENCE TO RELATED APPLICATIONS

This application is the National Stage of PCT/AT2013/050152 filed on Aug. 6, 2013, which claims priority under 35 U.S.C. §119 of Austrian Application No. A 877/2012 filed on Aug. 8, 2012, the disclosure of which is incorporated by reference. The international application under PCT article 21(2) was not published in English.

The invention relates to an apparatus for the plasma coating of a substrate, in particular a press platen, comprising a vacuum chamber and a therein arranged electrode, which is in the operational state oriented to be essentially parallel to said substrate and opposite its face to be coated. Furthermore, a method for producing a substrate, in particular a press platen, is provided. Finally, the invention also relates to a method for producing single-layer or multi-layer board-like materials, in particular plastic materials, wood materials and laminates with and without overlay papers.

An apparatus and a method of the aforementioned kind are principally known. Document EP 1 417 090 B1, for instance, discloses a method for processing and producing a surface of a material with a reproducible degree of luster and a pressing tool for using said method. In order to increase the useful lifetime of the pressing tools, a pressing tool is provided with a coating that is made of carbon with diamond-like layers. This causes the friction wear of the pressing tool surface to be considerably reduced when highly friction-resistant materials, such as for example in the manufacturing of floor boards with corundum particles in the surface layer, are processed.

The aforementioned diamond-like layers are also known as "diamond like carbon" (DLC). These are characterized by high hardness and high resistance to wear and may be produced by using plasma enhanced chemical vapor deposition (PECVD). In this connection, a plasma is ignited above the workpiece to be coated from which plasma ionized components pass to the workpiece to be coated.

As there is a trend towards workpieces of the aforementioned type (e.g. floor boards, chipboards, fiberboards, etc.) having permanently growing formats correspondingly large press platens are required for the manufacture of such materials. It is in this case a problem that the layer applied to the press platen can be produced within a very narrow tolerance range and can therefore only be reproduced to a certain extent only. This is caused by the processing conditions which are inhomogeneous or hard to influence. The concentration of ions in the plasma across the press platen, for instance, differs very much and is hard to control, thereby causing that the plasma has different velocities of deposition even in the event that the field strength and the current intensity across the electrode are constant. It is in reality not possible to achieve a field distribution and current distribution which are constant or extend within a narrow tolerance range anyway, so that also undesired differences in the velocity of deposition of the layer to be applied are caused.

Unfortunately, the above-mentioned fluctuations furthermore cause instabilities in the process as well as oscillation phenomena. Due to the increased conductivity, a locally increased ion concentration in the plasma, e.g., leads to a locally increased current intensity, which can not only cause an increased velocity of deposition in respect of the layer to be applied, but—in extreme cases—can also cause a flashover. Normally, this high current destroys the surface of the press platen to such an extent that it must be disposed of. This causes a high economic damage as both the basic material of the press platen and the processing of the latter (e.g. the photolithographic implementation of a surface structure or the creation of a surface structure or rather a mask for the photolithography by means of the ink jet, screen printing, offset, or calendar print method) are very expensive. The larger the press platen is the larger is also the probability that one of the above-mentioned errors occurs.

It is therefore one objective of the present invention to provide an improved apparatus and an improved method for the plasma coating of a substrate, in particular a press platen. In particular a possibility to apply a layer onto a substrate within a narrow tolerance range and to prevent an electric flashover in the plasma, or to moderate its effects, shall be provided. A further objective of the invention is to provide an improved manufacturing method for single-layer or multi-layer board-type materials. In particular the manufacture of large-format plates shall be facilitated or enabled.

The objective of the invention is achieved by an apparatus of the aforementioned type wherein the electrode is segmented and each of the electrode segments has a dedicated connection for an electrical energy source.

The objective of the invention is moreover achieved by a method for manufacturing a substrate, in particular a press platen, comprising the steps:
a) arranging a substrate to be coated in a vacuum chamber opposite a segmented electrode arranged in the vacuum chamber and aligned to be essentially parallel with the electrode,
b) activating at least one energy source that is assigned to an electrode segment and
c) introducing a gas which causes a plasma-enhanced chemical vapor deposition on the substrate (e.g. press platen blank).

Finally, the objective of the invention is achieved by a method for manufacturing single-layer or multi-layer board-type materials, in particular plastic materials, wood materials and laminates with and without overlay papers, in which method a substrate or press platen manufactured according to the aforementioned method is used.

In the context of the invention, an electrode segment is defined by the fact that it may reach a considerably different potential than the other segments without a significant compensating current being flowing. In other words, a high insulating resistance is provided between the individual segments. Within the meaning of the invention, segmentation should be understood in terms of electricity and not necessarily in terms of construction. The term "connection" should be defined widely, and it is principally possible to consider it as a possibility for the electrical connection of any type of design.

According to the invention, the segmentation achieves that the supply of the electrode with energy may vary from place to place, or that the supply of electric energy can be influenced in a differentiated way. This does not only allow a distribution of the electric field strength or the current across the substrate to be predefined, but it is due to the segmentation of the electrode also possible to easily keep the predetermined values within a narrow tolerance range. The energy supply per electrode segment can be regulated individually, for instance. The gaps between the individual segments furthermore allow the process gas to be led to the substrate more easily, so that the ion concentration across the substrate can be kept constant or within a narrow range of tolerance.

Finally, also the probability of a flashover occurring in the plasma is considerably reduced, or rather, the effects of the latter are considerably moderated. The segmentation does not allow the electrical energy to be "drawn off" from other sections of the electrode and concentrated on one point as it is the case with an unsegmented electrode. In this case, the flashover causes that the energy or power available for coating the complete substrate is concentrated on one point and thereby resulting in accordingly heavy damages of the substrate.

If, however, electrode segments are provided, only the electrical energy or power provided for the coating of the substrate in this region can be concentrated on one point, which energy or power is naturally less than the energy/power provided for the coating of the complete substrate. The finer the segmentation is the smaller are the aforementioned amounts of energy or powers. The correspondingly fine segmentation can cause the power per electrode segment to be reduced to such a great extent at constant power per area that the electrical energy within the segment does no longer suffice to cause a flashover. In any case, the effects of a flashover can be moderated, as the latter only slightly damages the surface of the substrate, so that it is easily possible to continue using the latter or to repair the substrate with only little effort.

In most cases, the general aim is to coat a substrate as evenly as possible. In such a case, the above-mentioned measures can be used in order to achieve that a distribution of the current intensity, the electric field strength as well as the concentration of ions in the plasma is as homogenous as possible. It is alternatively possible that the aim of the process is an inhomogeneous coating of the substrate. In such a case, the above-mentioned measures can be used to achieve an inhomogeneous distribution of the current intensity, the electric field strength as well as the concentration of ions in the plasma, wherein said inhomogeneous distribution is however within a narrow predetermined tolerance range.

By providing the mentioned substrates or press platens, also the manufacture of large-format plate materials is facilitated or enabled. Within the scope of the invention, large-format plates are deemed to be plates having a size of more than or equal to 1 $m^2$, in particular plates having a size of more than or equal to 5 $m^2$, and in the specific case having a size of more than or equal to 10 $m^2$. This shall for instance also allow board-type materials having a standard size of 2×5 m to be produced in one working step.

Advantageous embodiments and developments of the invention result from the sub-claims as well as from the description in connection with the Figures.

It is advantageous if the individual electrode segments are insulated from one another. It is thereby possible to achieve that virtually no compensating current can flow between the segments.

Another advantage is achieved if the individual electrode segments are connected with one another via narrow webs or defined ohm resistances. This allows for low, defined compensating currents between the segments, or the electrode can be formed as one piece despite of its segmentation, provided that narrow webs are provided between the segments.

An additional advantage is achieved if the individual electrode segments are connected with at least one energy source via narrow webs or defined ohm resistances. By providing different resistances in respect of the individual electrode segments, this variant may advantageously allow the electrode segments to be differently supplied with energy by means of only one energy source. Additionally the probability for the occurrence of an electric flashover in the plasma is significantly reduced, or the effects of the latter are noticeably moderated as the resistances impede a concentration of electrical energy in one individual electrode segment.

It is of particular advantage if the apparatus comprises several energy sources which can be closed-loop/open-loop controlled independently of one another and are connected with the electrode segments via the above-mentioned connections. It is thereby possible to supply several electrode segments with energy independently of one another. For instance, a particular current and/or a particular potential can provided for the latter and—in case the energy source is closed-loop controlled—also adhered to with varying procedural conditions.

It is of particular advantage if one electrode segment is connected with one energy source respectively, which can be open-loop/closed-loop controlled independently of the other energy sources. Thus, one energy source is activated per each electrode segment and open-loop/closed-loop controlled independently of the remaining energy sources. It is thereby possible to supply nearly all electrode segments with energy independently of one another. It is for instance possible that for each electrode segment a dedicated current intensity and/or potential is provided and—in case the energy source is closed-loop controlled—also adhered to with varying procedural conditions.

It is moreover of particular advantage if the apparatus comprises a control system which is adapted to switch one energy source alternately to one electrode segment of a group of electrode segments, and the connections of the remaining electrode segments of this group to an open-state which is insulated from firstly mentioned electrode segment. Thus, one energy source is alternately switched to one respective electrode segment of a group of electrode segments, and the connections of the remaining electrode segments of this group are switched to an open-state which is insulated from the firstly mentioned electrode segment. It is thereby possible that only a low number of energy sources supplies all electrode segments with energy independently of one another. This being the case, one electrode segment of a group of electrode segments is connected with the energy source respectively and a current and/or a potential is predetermined for the latter. The remaining electrode segments of this group are switched to an open-state, where they are insulated from the energy source or from the thereto connected electrode segment. The current for these electrode segments is consequently naught, or it is possible that only a low compensating current flows between the segments. Accordingly, the potential can virtually have any value ("floating potential"). Once a certain period of time has passed the energy source is connected with another electrode segment of the group and the electrode segment connected before is also switched to an open-state. It is thereby possible to connect all electrode segments of the group with the energy source one after the other. This does absolutely not require that the electrode segments are connected with the energy source in the same order in each cycle. It is also possible that one electrode segment is connected with the energy source several times in the course of one cycle in order to apply a thicker coating to the substrate, for instance.

The electrode segments assigned to the activated energy source can also be a result of a random selection. This may avoid effects which may result from the continuous repetition of one and the same cycle.

It is also of particular advantage if electrode segments arranged according to the white squares of a chessboard and electrode segments arranged according to the black squares of a chessboard are supplied with electrical energy in alternation. In this variant, electrode segments arranged in a matrix are activated in alternation. In a first section of time, those segments are activated the sum of the line and column index of which equals to an even number. In a second section of time, those segments are activated the sum of the line and column index of which equals to an odd number. Thereupon, another first section of time follows, etc.

It is advantageous if the area of an electrode segment is smaller than or equal to 1 m². It is even more advantageous if said area is smaller than or equal to 0.25 m². These values constitute a good compromise which allows the coating of the substrate to be succeeded well at a not too high segmentation of the electrode. Although the mentioned values have turned out to be advantageous, the invention shall naturally not be limited to the latter. It is of course also possible that other values are selected in the context of the benefits procured by the invention.

It is favorable if the energy sources are provided in the form of current sources. This allows the velocity of deposition to be set in accordance with the coating to be applied to the substrate.

It is in this connection of advantage if the maximum current intensity per electrode segment (peak current) is smaller than or equal to 150 A. It is even more advantageous if said current intensity is smaller than or equal to 15 A. These values constitute a good compromise allowing the coating of the substrate to be succeeded well at a not too high risk of a destructive electrical flashover between electrode and substrate. Although the mentioned values have turned out to be advantageous, the invention shall naturally not be limited to the latter. It is of course also possible that other values are selected in the context of the benefits procured by the invention.

It is also advantageous if the electrode segments are embodied to be grid-like. This allows the process gas to be led to the substrate to be coated in a particularly favorable way.

It is moreover of advantage if the electrode in its edge region is bent towards the substrate to be coated. It is in this way possible to compensate a dropping of the electrical field strength in the plasma in the edge region of the electrode, as it results from a plate-shaped electrode, the distance of which to the substrate is the same at every point.

An advantageous variant of a method for the coating of a substrate is also provided if the voltage between an electrode segment and the substrate to be coated is measured and the energy supply is limited or switched off in the event that a slump of the mentioned voltage is determined. If said voltage very quickly drops to a relatively low value, it may be assumed that an electrical flashover is taking place between the workpiece and the electrode. In order to limit its harmful effects or to completely end them, the energy supply of the electrode segment concerned is limited or even switched off completely.

It is of advantage if the electrode segments located at the edge of the electrode are set at a higher potential than the inner segments. In this way, a drop of the electrical field strength in the plasma such as that resulting from a plate-shaped electrode aligned to be parallel with the substrate can be compensated.

It is also of advantage if the electrode segments located at the edge of the electrode are set or regulated to a higher current intensity than the inner segments. Thus, the edge of the substrate can be coated with a thicker layer. These regions of the substrates are usually subjected to the highest stress during the manufacture of plate-shaped materials.

It is finally advantageous if the plate-shaped material comprises particles having a Vickers hardness between 1000 and 1800 or corundum and aluminum oxide $Al_2O_3$, respectively, in particular in the region of its surface facing the press platen. The advantage of the coated press platen is very obvious at this stage in particular, as the coating ensures a high useful lifetime of the press platen despite of abrasive components contained in the material to be produced. Press platens for large-format board-type materials according to prior art cannot provide such long useful lifetimes.

At this stage it should be noted that the variants described in respect of the coating apparatus and the therefrom resulting advantages can also be transposed to the method for the coating of the substrate and vice versa in terms of meaning.

For a better understanding of the invention the latter is explained in more detail with reference to the following Figures.

FIG. 1 schematically shows an apparatus for the plasma coating of a substrate;

Firstly, it should be pointed out that the same parts described in the different embodiments are denoted by the same reference numbers and the same component names and the disclosures made throughout the description can be transposed in terms of meaning to same parts bearing the same reference numbers or same component names Also details relating to position used in the description, such as e.g. top, bottom, side etc. relate to the currently described and represented figure and in case of a change in position should be adjusted to the new position. Individual features or combinations of features from the different embodiments illustrated and described may be construed as independent inventive solutions or solutions proposed by the invention in their own right.

All statements regarding value ranges in the present description are to be understood in such a way that they also include any and all partial ranges arising from them. For example, the statement of 1 to 10 is to be understood as including all partial ranges starting from the lower limit 1 and the upper limit 10, i.e., all partial ranges begin with a lower limit of one or more and end at an upper limit of 10 or less, e.g., 1 to 1.7 or 3.2 to 8.1 or 5.5 to 10.

Figure 1:
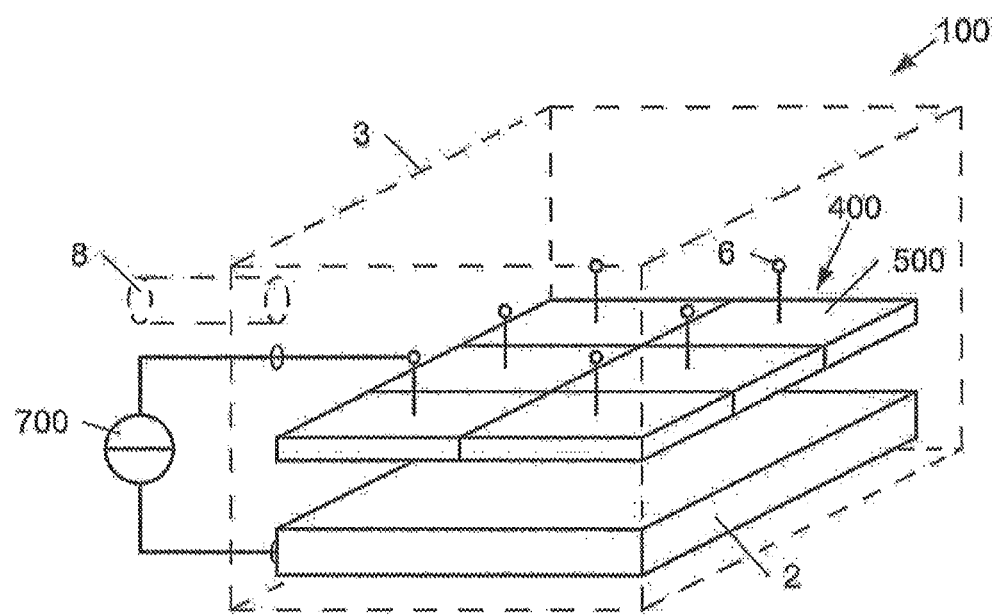

FIG. 1 shows an apparatus 100 for the plasma coating of a substrate 2 comprising a vacuum chamber 3 and a therein arranged electrode 400, which is in the operational state oriented to be essentially parallel to said substrate 2 and opposite its face to be coated. With respect to the following considerations it is assumed that the substrate is a press platen 2. It is naturally also possible to transpose the following teaching to other substrates.

The electrode 400 is segmented and each segment 500 has a connection 6 dedicated for an electrical energy source 700, which is configured to be a power source in the present example. It is naturally also possible to realize the energy source as a voltage supply, for instance. Finally, FIG. 1 also shows a connection 8 for introducing a process gas (e.g. $CH_4$) into the vacuum chamber 3 where there is a pressure of approximately 1 mbar, for instance.

It is preferred if the area of an electrode segment 500 is smaller than or equal to 1 $m^2$, and the current intensity of a power source 700 is less than or equal to 150 A. These values are a good compromise wherein the good results of a coating of the press platen 2 are achieved while the electrode 400 is not segmented too heavily and the risk of a destructive electric flashover between electrode 400 and press platen 2 is not too high.

It is generally possible for the energy source 700 to supply direct current or alternating current. A particular good coating of the press platen 2 is achieved by impulse-type current. In this case, the current amplitude of the impulses are preferably smaller than 150 A. The polarity of the pulses can also be reversed from time to time if away electrical loads at the applied layer are to be led away, e.g. if electrically insulating layers are being applied. It is for instance possible that one of ten pulses has a different polarity.

Figure 2:
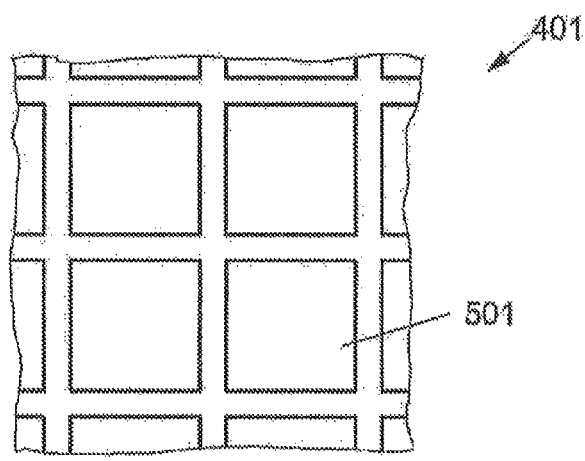
FIG. 2 is a first schematic example of an electrode having segments completely insulated from one another.

FIG. 2 shows an example of an electrode 401, the segments 501 of which are fully insulated from one another. The individual segments 501 are accordingly only provided in the form of conductive plates spaced apart from one another. These can for instance be applied to a non-conductive substrate so that the handling of the electrode 401 is easier. In order for the process gas to reach the press platen 2 more easily, in particular through recesses in the aforementioned substrate in the region between the segments 501, the electrode 401 may have holes. These holes can be provided in the form of elongated holes, for example (see also FIG. 3).

Figure 3:
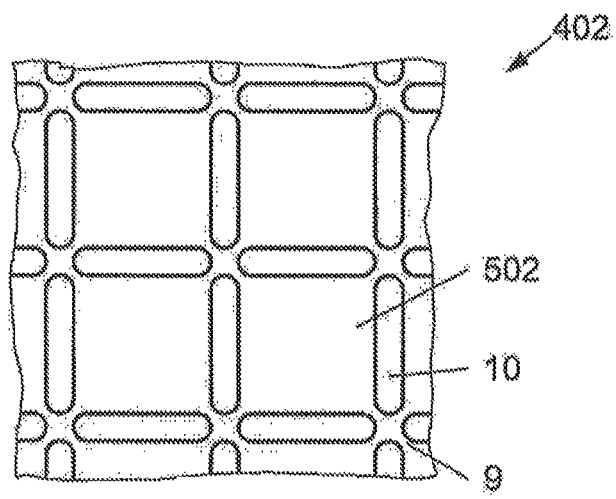
FIG. 3 is a second schematic example of an electrode having segments which are connected with one another.

FIG. 3 shows another example of an electrode 402, the segments 502 of which are connected with one another via small webs 9 and consequently without (high) Ohm resistances. It is thus generally possible that the electrode 402 is provided in one piece, for instance, by milling, cutting, nibbling or laser-cutting the corresponding recesses 10 into a sheet.

Figure 4:
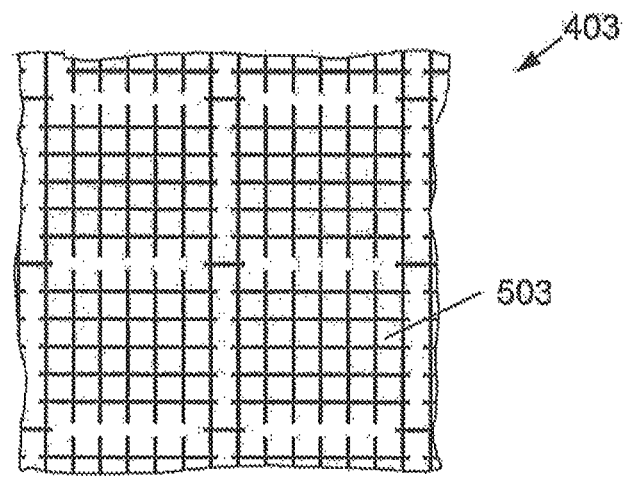
FIG. 4 shows a further schematic example of a grid-like electrode.

FIG. 4 shows a further example of an electrode 403 where the electrode segments 503 are configured to be grid-like. It is thereby even easier for the process gas to reach the press platen 2.

Figure 5:
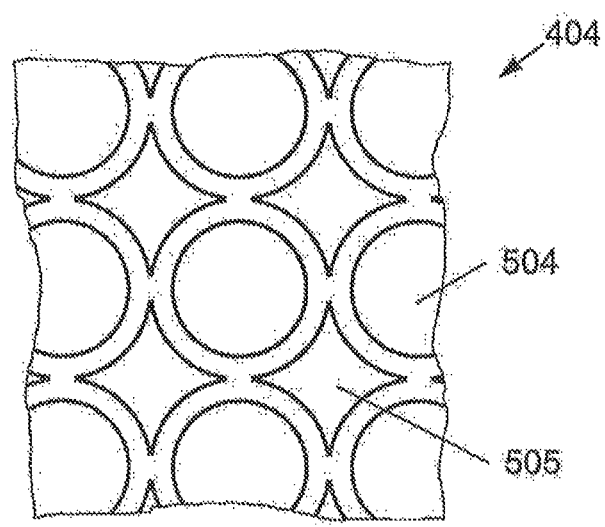
FIG. 5 is a further schematic example of an electrode having segments of different shapes.

FIG. 5 illustrates another example of an electrode 404 which is formed from circular electrode segments 504 and check-shaped electrode segments 505. This is a purely illustrative example and only showing that it is not absolutely required for an electrode 400 to be provided in the form of rectangular electrode segments 500. Apart from the shapes illustrated in FIG. 5, a plurality of other non-rectangular shapes may be used.

Figure 6:
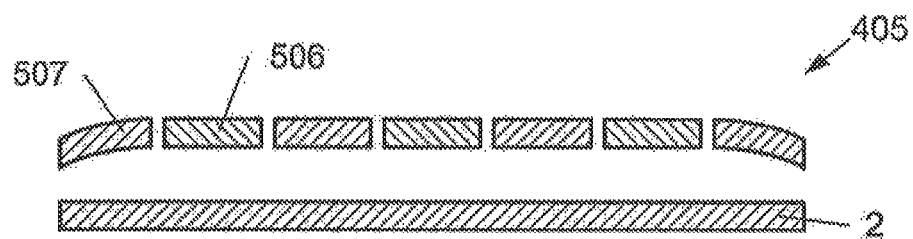
FIG. 6 shows a further schematic example of an electrode which is bent in its edge-region.

FIG. 6 shows an example of an electrode 405 which is in its edge region bent in the direction of the press platen 2 to be coated. In the specific case, the electrode segments 506 are arranged to be parallel with the press platen 2, whereas the electrode segments 507 are tilted in the direction of the press platen 2 or—as in the present example—bent in the direction of the press platen 2. In this way, a drop of the electrical field strength in the plasma, such as that resulting from a plate-shaped electrode which is also in the edge region of the press platen 2 oriented to be parallel with the latter, can be compensated.

Alternatively or additionally to the embodiment as shown in FIG. 6 it is for instance also conceivable that segments 500 located in the edge region of the electrode 400 (see also FIG. 11) are arranged to be closer to the press platen 2 than inner segments. In particular all segments 500 can be arranged to be parallel with the press platen 2.

A method for manufacturing a press platen 2 now comprises the following steps:

a) arranging a press platen 2 to be coated in a vacuum chamber 3 opposite a segmented electrode 400 arranged in the vacuum chamber 3 and aligned to be essentially parallel with the electrode,
b) activating at least one energy source 700 that is assigned to an electrode segment 500 and
c) introducing a gas which causes a plasma-enhanced chemical vapor deposition on the press platen blank 2.

For the sake of completeness it should be noted at this stage that step c) may naturally be carried out prior to step b).

It is only for illustrative reasons, that FIG. 1 shows only one single energy source 700, which is connected with an electrode segment 500. This can principally be connected with the different electrode segments 500 one after the other. It is alternatively also conceivable that an apparatus for the plasma coating of a press platen 2 comprises several energy sources 700 which can be open-loop/closed-loop controlled independently of one another, which energy sources 700 can be connected with the electrode segments 500 via the connections 6.

Figure 7:
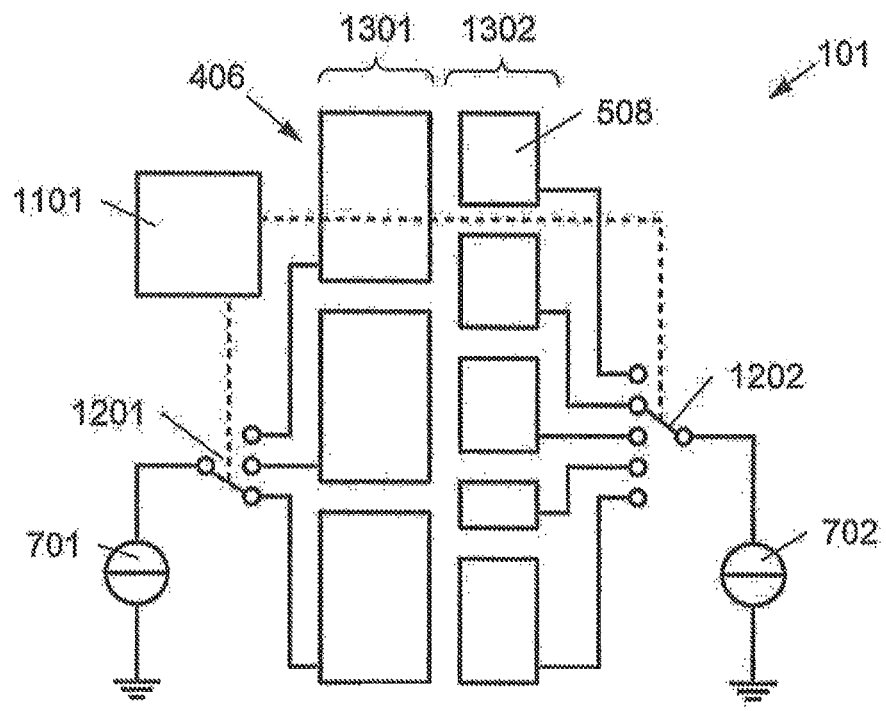
FIG. 7 is an illustrative example where a control unit switches an energy source to different electrode segments.

To this end, FIG. 7 shows an illustrative example where a control unit 1101 of an apparatus 101 (here illustrated without vacuum chamber 3) is configured so as to switch, with the aid of the switches 1201 and 1202, one energy source 701, 702 to one electrode segment 508 of a group 1301, 1302 of electrode segments 508, and to switch the connections of the other electrode segments 508 of this group to an open-state insulated from the firstly mentioned electrode segment 508 (the press platen 2 of this example and the further examples is connected to the ground). In specific terms, the electrode segments 508 in the embodiment illustrated as an example in FIG. 7 are divided into two groups 1301 and 1302, the first group 1301 comprising three electrode segments 508 of identical size and the second group 1302 comprising five electrode segments 508 differing in size. The division is of purely illustrative character and is to demonstrate that the electrode segments 508 of an electrode 406 are not required to be of identical size. FIG. 7 furthermore shows that the electrode segments 508 are not required to have quadratic shape, but can also have a general rectangular shape. The electrode segments 508 can in particular be embodied to have the shape of bands, rods and/or strips. A first energy source 701 is now switched to one electrode segment 508 of the group 1301, a second energy source 702 is switched to one electrode segment 508 of group 1302. The other electrode segments 508 are switched to an open-state.

Once a certain period of time has passed, the assignments between the energy sources 701, 702 and the electrode segments 508 are changed. This means that the energy source 701 is connected with another electrode segment 508 of group 1301 and the previously connected electrode segment 508 is switched to an open-state. By analogy, the energy source 702 is connected with another electrode segment 508 of group 1302 and the previously connected electrode segment 508 is switched to an open-state. It is thereby possible to connect all electrode segments 508 of the groups 1301 and 1302 with the energy sources 701 and 702 one after the other. This allows all electrode segments 508 to be supplied independently of one another with energy by means of only a low number of energy sources 701, 702.

The electrode segments 508 assigned to the activated energy source 701, 702 can be a result of a random selection or a result of a predetermined scheme. The electrode segments 508 are not required to be connected with the energy source 701, 702 in the same order in each cycle. It is also possible that one electrode segment 508 is connected with the energy source 701, 702 several times in the course of one cycle.

A particularly advantageous method is provided if electrode segments arranged so as to correspond to the white squares of a chessboard and electrode segments arranged so as to correspond to the black squares of a chessboard are supplied with electrical energy in alternation.

Figure 8:
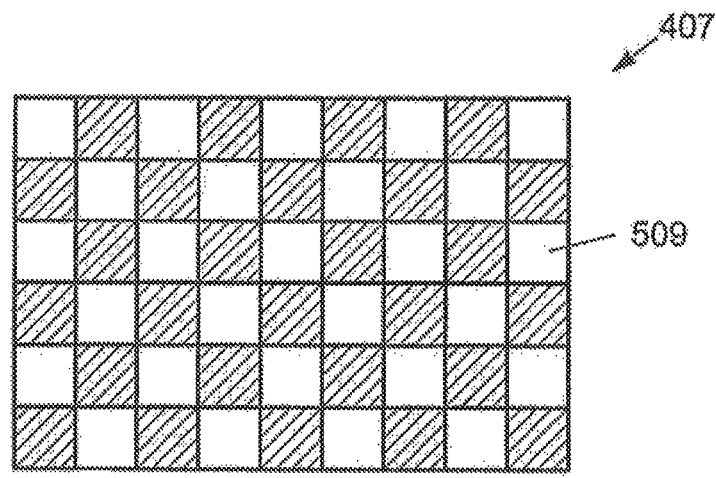
FIG. 8 shows an example of an electrode the segments of which are arranged and controlled according to the pattern of a chessboard.

To this end, FIG. 8 shows an illustrative example of electrode segments 509 which are arranged in a 6×9 matrix, in order to emphasize that it is not necessarily required for the electrode segment 509 to be arranged in a 8×8 matrix, as it is the case with a chessboard. In accordance with this variant, the "white" segments 509 are activated in a first period of time, in a second period of time, the "black" segments 509 (illustrated with hatched lines) are activated.

When an energy source 701, 702 is being assigned to an electrode segment 508, it is principally possible to predetermine a current intensity and/or a potential of the same. The remaining electrode segments 508 which are not assigned to an energy source 701, 702 are switched to an open-state, wherein they are insulated from the energy source 701, 702 or from the thereto connected electrode segment 508. The current for these electrode segments 508 is consequently naught, or it is possible that there is only a low compensating current flowing between the segments 508. Accordingly, the potential can virtually have any value ("floating potential").

Figure 9:
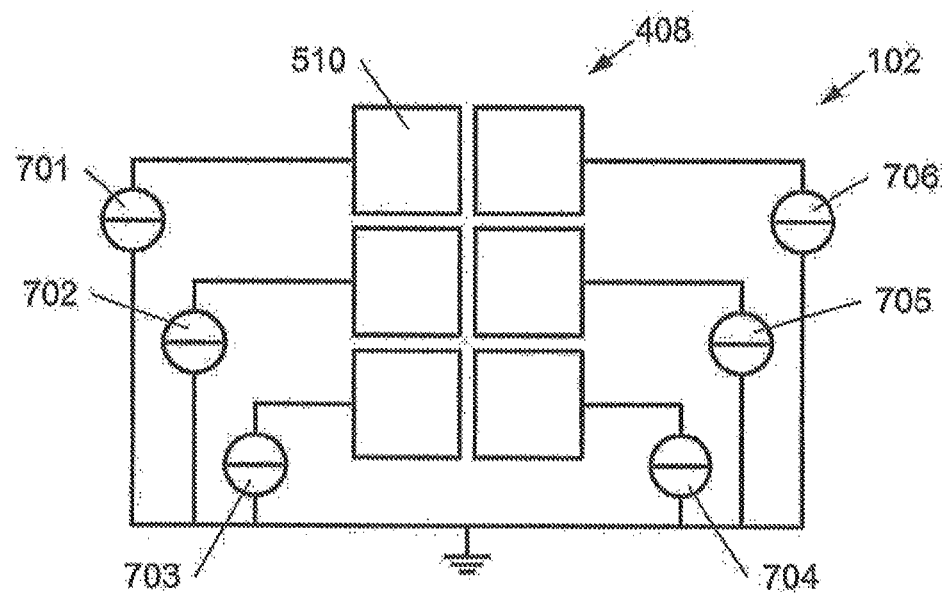
FIG. 9 shows an illustrative example where one electrode segment is connected with one energy source each.

FIG. 9 shows an example where there is one electrode segment 510 connected with one energy source 701, 702 each, which can be open-loop/closed-loop controlled independently of the remaining energy sources 701 . . . 706. In other words, the energy source 701 can be open-loop/closed-loop controlled independently of the energy sources 702 . . . 706, etc. Accordingly, one energy source 701 . . . 706 is activated per each electrode segment 501 and open-loop/closed-loop controlled independently of the remaining energy sources 701 . . . 706. It is thereby possible to supply nearly all electrode segments 510 with energy independently of one another. It is for instance possible that for each electrode segment 501 a particular current intensity and/or a particular potential is provided and—in case the energy source 701 . . . 706 is closed-loop controlled—also adhered to with varying procedural conditions.

Figure 10:
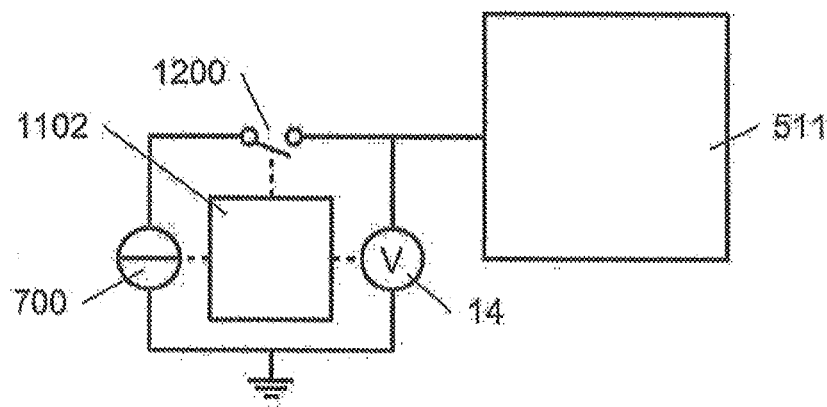
FIG. 10 shows another illustrative example where the voltage between an electrode segment and the substrate is measured.

In another example illustrated in FIG. 10, the voltage between an electrode segment 511 and the press platen 2 to be coated is measured with the aid of a voltmeter 14, and the energy supply 700 is limited by means of a control unit 1102 and/or the supply of current to the electrode segment 511 is switched off using a switch 1200 operated by the control unit 1102, if a drop of said voltage is detected. The voltmeter 14 can for instance be provided in the form of an analogue-digital-converter which is connected to a microcontroller where e.g. also the control unit 1102 can be integrated in. In this way, an electrical flashover between the electrode segment 511 and the press platen can be detected and its destructive effect can be limited. It is moreover also possible to actively terminate the flashover by means of the above-mentioned measures. Of course, also a common control unit for the functionality of the control unit 1101 illustrated in FIG. 7 and the control unit 1102 illustrated in FIG. 10 can be provided.

Figure 11:
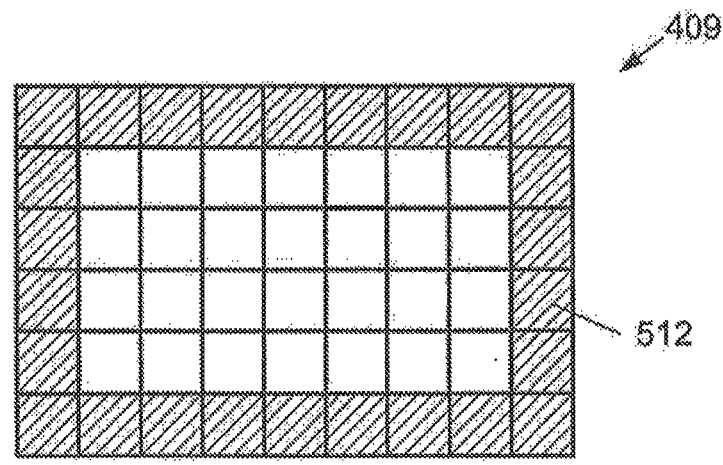
FIG. 11 shows a schematic example where segments located at the edge of the electrode are set at a higher potential and/or set/closed-loop controlled to a higher current intensity than inner segments and FIG. 12 shows a schematic example where the electrode segments are connected with an energy supply via resistances.

FIG. 11. illustrates a further variant of the method for the plasma coating of a press platen 2, where segments 512 (indicated by hatched lines) located at the edge of an electrode 409 are set at a higher potential and/or set/regulated to a higher current intensity than inner segments 512 (in white). It is thereby possible to compensate a drop of the electric field strength in the plasma—as it results from a board-type electrode 409 arranged to be parallel with the press platen 2—(see also FIG. 6) and/or to provide the press platen with a thicker layer at its edge. These regions of the press platens 2 are usually subjected to the highest stress during the manufacture of plate-shaped materials.

Figure 12:
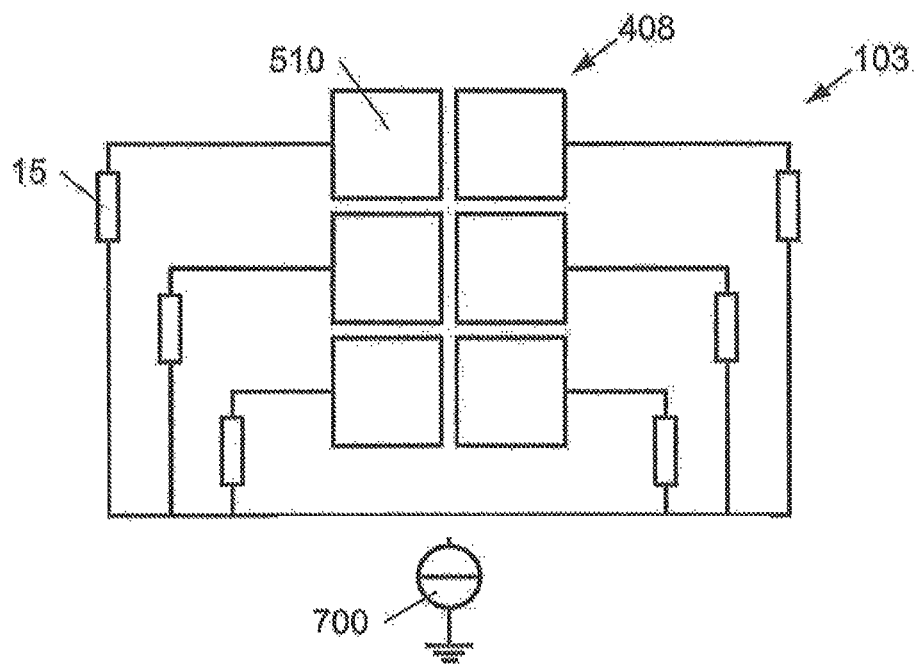

FIG. 12 finally shows a schematic example where the electrode segments 510 are connected with an energy supply 700 via resistances 15. By providing different resistances 15 this variant may advantageously allow the electrode segments 510 to be differently supplied with energy by means of only one energy source 700. It is naturally also possible to provide identical resistances 15. Additionally, the probability for the occurrence of an electric flashover in the plasma is significantly moderated, or the effects of the latter are noticeably reduced as the resistances 15 impede a concentration of electrical energy in one individual electrode segment 510. The arrangement 103 illustrated in FIG. 12 can naturally also be used in combination with the already illustrated arrangements. The arrangement of several energy sources instead of one single energy source 700 is possible, for instance. It is moreover also conceivable that further, not shown resistances are arranged between the electrode segments 510, for instance as the electrode 408 is embodied according to the FIGS. 3 and 4. It is finally also conceivable that the resistances 15 are provided in the form of narrow terminals 6, in particular if comparably high currents are to be led to the electrode segment 510.

The embodiments illustrated as examples represent possible variants of the apparatus 100 . . . 103 for the plasma coating of a substrate, and it should be pointed out at this stage that the invention is not specifically limited to the variants specifically illustrated, and instead the individual variants may be used in different combinations with one another and these possible variations lie within the reach of the person skilled in this technical field given the disclosed technical teaching. Accordingly, all conceivable design variants which can be obtained by combining individual details of the design variants described and illustrated are possible and fall within the scope of the invention.

It is in particular stated that said apparatus 100 . . . 103 may in reality also comprise more components than those illustrated. It is in particular pointed out the disclosed teaching is indeed particularly advantageous in connection with pressing platens, it may however be unrestrictedly transposed to other substrates, such as to those for deep drawing, extrusion and pressing tools in general.

The described substrates 2 or the press platens are specifically suitable for the manufacturing of single-layer or multi-layer board-type materials. This shall in particular mean thermoplastic and duroplastic such as epoxy resins, polyester resins and phenolic resins at least the surfaces facing the press platen 2 of which are charged with particles having a Vickers hardness between 1000 and 1800 or also with corundum particles ($Al_2O_3$) in order to provide a better friction wear resistance. It is likewise possible to manufacture wood fiber materials such as chipboards, medium-density fiberboards (MDF) and high-density fiberboards. For manufacturing a laminate it is in particular possible to coat these wood materials with layers of plastic of the aforementioned type or with paper. Furthermore, it is also easily possible to provide glass fiber reinforced plastic or carbon fiber reinforced plastic with a surface structure. It is finally also possible to produce artificial stone or "engineered stone" (composite material of stone and resin). In particular when using hard rock, such as granite, a long useful lifetime of the disclosed substrates 2 or press platens turns out to be advantageous.

For the sake of good order, finally, it should be pointed out that, in order to provide a clearer understanding of the structure of the apparatus 100 . . . 103 for the plasma coating of a substrate 2, it and its constituent parts are illustrated to a certain extent out of scale and/or on an enlarged scale and/or on a reduced scale.

The objective underlying the independent inventive solutions may be found in the description.

LIST OF REFERENCE NUMERALS

100 . . . 103 Apparatus for the plasma coating
2 Substrate (pressing platen)
3 Vacuum chamber
400 . . . 409 Electrode
500 . . . 512 Electrode segment
6 Electrode connection
700 . . . 702 Energy source
8 Gas connection
9 Web
10 Recess
1101, 1102 Control unit
1201, 1202 Switch
1301, 1302 Group of electrode segments
14 Voltmeter
15 (Ohm) resistance

The invention claimed is:

1. Method for the plasma-coating of a press platen comprising the steps:
   a) arranging a press platen to be coated in a vacuum chamber opposite a segmented electrode arranged in the vacuum chamber and aligned to be essentially parallel with the electrode,
   b) activating at least one energy source that is assigned to an electrode segment of the electrode, wherein the electrode segment has a size chosen in such away that electrical energy within the electrode segment is insufficient for a flashover and
   c) introducing a gas which causes a plasma-enhanced chemical vapor deposition on the press platen blank, wherein the area of the manufactured plates is larger than or equal to 1 $m^2$.

2. Method according to claim 1, wherein one energy source is activated per each electrode segment and open-loop/closed-loop controlled independently of the remaining energy sources.

3. Method according to claim 1, wherein one energy source is alternately switched to one respective electrode segment of a group of electrode segments and the connections of the rest of the electrode segments of this group is switched to an open-state insulated from the firstly mentioned electrode segment.

4. Method according to claim 3, wherein the electrode segment which is assigned to the activated energy source is a result of a random selection.

5. Method according to claim 3, wherein the electrode segments arranged so as to correspond to the white squares of a chessboard and electrode segments arranged so as to correspond to the black squares of a chessboard are supplied with electrical energy in alternation.

6. Method according to claim 1, wherein the voltage between an electrode segment and the press platen to be coated is measured and the energy supply is limited or switched off in the event that a drop of said voltage is detected.

7. Method according to claim 1, wherein electrode segments located at the edge of the electrode are set at a higher potential than inner electrode segments.

8. Method according to claim 1, wherein electrode segments located at the edge of the electrode are set at/regulated to a higher current intensity than inner electrode segments.

9. Method for the manufacture of single-layer or multi-layer board type materials, in particular of plastic materials, wood materials and laminates with and without overlay papers, wherein a substrate or a press platen, which is manufactured by the steps
   a) arranging a substrate/press platen to be coated in a vacuum chamber opposite a segmented electrode arranged in the vacuum chamber and aligned to be essentially parallel with the electrode,
   b) activating at least one energy source that is assigned to an electrode segment of the electrode, wherein the electrode segment has a size chosen in such a way that electrical energy within the electrode segment is insufficient for a flashover and
   c) introducing a gas which causes a plasma-enhanced chemical vapor deposition on the substrate/press platen blank, is used,
   wherein the area of the manufactured plates is larger than or equal to 1 $m^2$.

10. Method according to claim 9, wherein the board-type material contains particles having a Vickers hardness of between 1000 and 1800, in particular in the region of its surface facing the press plate.

11. Method according to claim 9, wherein the board-type material contains corundum or aluminum oxide $Al_2O_3$, in particular in the region of its surface facing the press platen.

* * * * *

UNITED STATES PATENT AND TRADEMARK OFFICE
CERTIFICATE OF CORRECTION

PATENT NO.        : 9,530,624 B2
APPLICATION NO.   : 14/420194
DATED             : December 27, 2016
INVENTOR(S)       : Gebeshuber et al.

It is certified that error appears in the above-identified patent and that said Letters Patent is hereby corrected as shown below:

In the Claims

Column 11, Line 58, Claim 1 change "away" to -- a way --.

Column 12, Line 55, Claim 10 change "plate" to -- platen --.

Signed and Sealed this
Fourteenth Day of February, 2017

Michelle K. Lee
*Director of the United States Patent and Trademark Office*